US006454913B1

(12) United States Patent
Rasmussen et al.

(10) Patent No.: US 6,454,913 B1
(45) Date of Patent: Sep. 24, 2002

(54) PROCESS FOR DEPOSITION OF SPUTTERED SHAPE MEMORY ALLOY FILMS

(75) Inventors: Gregory K. Rasmussen; Fenglian Chang, both of Grand Blanc; Terry J. Gold, Davison; Maryann G. Seibert, Fenton; Jinping Zhang, Grand Blanc, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/904,072

(22) Filed: Jul. 12, 2001

(51) Int. Cl.⁷ ............................................. C23C 14/34

(52) U.S. Cl. ................................ 204/192.15; 204/192.2

(58) Field of Search .......................... 204/192.15, 192.2

(56) References Cited

U.S. PATENT DOCUMENTS

| | | | |
|---|---|---|---|
| 4,824,481 A | 4/1989 | Chatterjee et al. | 75/246 |
| 4,960,651 A | 10/1990 | Pettigrew et al. | 428/607 |
| 5,061,914 A | 10/1991 | Busch et al. | 337/140 |
| 5,108,523 A | 4/1992 | Peterseim et al. | 148/402 |
| 5,114,504 A | 5/1992 | AubJudon, II et al. | 148/402 |
| 6,033,536 A | 3/2000 | Ichihara et al. | 204/192.2 |

FOREIGN PATENT DOCUMENTS

| | | | | |
|---|---|---|---|---|
| EP | 0 640 964 A1 | 3/1995 | | G11B/11/10 |
| WO | WO 96/39547 | 12/1996 | | C23C/14/34 |
| WO | 01/21851 A1 | * 3/2001 | | C23C/14/34 |
| WO | 01/21852 A1 | * 3/2001 | | C23C/14/34 |

OTHER PUBLICATIONS

Johnson, A.D., "Sputter Deposition of High Transition Temperature Ti–Ni–Hf Alloy Thin Films", Dec. 5, 1995, Journal De Physique IV, Colloque C8, supplement au Journal de Physique III, vol. 5, pp. C8–783—C8–801).*

Chapman, B., "Glow Discharge Processes", John Wiley & Sons, (1980), p. 188).*

D.S. Grummon, Li Hou, Z. Zhao, and T.J. Pence; "Progress on Sputter–Deposited Thermotractive Titanium–Nickel Films"; Journal de Physique IV, Colloque C8, supplement au Journal de Physique III, vol. 5, Dec. 1995; pp. C8–665–C8–670.

D.S. Grummon and T.J. Pence; "Thermotractive Titanium–Nickel Thin Films for Microelectromechancal Systems and Active Composites"; Mat. Res. Soc. Symp. Proc., vol. 459, 1997; pp. 331–343.

X.D. Han, W.H. Zou, R. Wang, Z. Zhang, D.Z. Yang and K.H. Wu; "The Martensite Structure and Aging Precipitates of a TiNiHf High Temperature Shape Memory Alloy"; Journal de Physique IV, Colloque C8, supplement au Journal de Physique III, vol. 5, Dec. 1995; pp. C8–753—C–758.

(List continued on next page.)

Primary Examiner—Steven H. VerSteeg
(74) Attorney, Agent, or Firm—John Van Ophen

(57) ABSTRACT

A process is provided for forming a thin film deposit of a Ni—Ti—Hf ternary shape memory alloy on a substrate by magnetron sputtering deposition having high transformation temperatures and good shape-memory and mechanical properties. The method of forming a thin film deposit of a ternary shape memory alloy on a substrate by sputtering deposition comprises arranging a Ni—Ti—Hf target and a substrate within a deposition chamber, maintaining a working distance from the target to the substrate of about 83 mm to 95 mm; heating the substrate to a temperature high enough to induce in-situ crystallization; introducing a krypton working gas into the deposition chamber; applying appropriate level of deposition power so that the deposition rate is from about 6 Å per second to about 120 Å per second; and, depositing a Ni—Ti—Hf shape memory alloy film having a composition ranging from about $Ni_{48}(TiHf)_{52}$ to $Ni_{50}(TiHf)_{50}$.

12 Claims, 3 Drawing Sheets

OTHER PUBLICATIONS

A. Ishida, M. Sato, A. Takei, K. Nomura, and s. Miyazaki; "Effect of Aging on Shape Memory Behavior of Ti–51.3 At. Pct Ni Thin Films"; Metallurgical and Materials Transactions A, vol. 27A, Dec. 1996; pp. 3753–3759.

Akira Ishida, Morio Sato, Atsushi Takei, and Shuichi Miyazaki; "Effect of Heat Treatment on Shape Memory Behavior of Ti–rich Ti–Ni Thin Films"; materials Transactions, JIM, vol. 36, No. 11 (1995), pp. 1349–1355.

M. Kohl, D. Dittmann, E. Quandt, and B. Winzek; "Thin Film Shape Memory Microvalves with Adjustable Operation Temperature"; Sensors and Actuators 83 (200), pp. 214–219.

S.A. Mathews, Manfred Wuttig, and Quanmin Su; "The Effect of Substrate Constraint on the Martensitic Transformation of Ni–Ti Thin Films"; Metallurgical and Materials Transactions A, Sep. 1996; pp. 2859–2861.

S. Miyazaki and K. Nomura; "Development of Perfect Shape Memory Effect in Sputter–Deposited Ti–Ni Thin Films"; Proc. IEEE Micro Electro Mechanical Systems (MEMS–94) Oiso, Japan, (1994), pp. 176–181.

K. Nomura, S. Miyazaki and A. Ishida; "Effect of Plastic Strain on Shape Memory Characteristics in Sputter–Deposited Ti–Ni Thin Films"; Journal de Physique IV, Colloque C8, supplement au Journal de Physique III, vol. 5, Dec. 1995; pp. C8–695—C8–700.

You, L.; "Investigation of High Transition Temperatures niTiHf Shape memory Aloy Thin Films for Micro–Actuators"; Dept. of Physics and Materials Science, City University of Hong Kong, KLN, Hong Kong, 1997.

* cited by examiner

PROCESS FOR DEPOSITION OF SPUTTERED SHAPE MEMORY ALLOY FILMS

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These shape-memory alloy ("SMA") materials, if plastically deformed while cool, will revert, exerting considerable force, to their original, undeformed shape when warmed. These energetic phase transformation properties render articles made from these alloys highly useful in a variety of applications. An article made of an alloy having shape-memory properties can be deformed at a low temperature from its original configuration, but the article "remembers" its original shape, and returns to that shape when heated.

For example, in nickel-titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the NiTi alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

SMA materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in size and usefulness.

The unique properties of SMA's further have been adapted to microelectromechanical systems ("MEMS") applications such as micro-valves and micro-actuators by means of thin film technology. Micro-actuators are desirable for such utilities as opening and closing valves, activating switches, and generally providing motion for micromechanical devices. The most well-known and most readily available SMA is an alloy of nickel and titanium. NiTi SMA has been extensively investigated as one of the most promising materials for MEMS such as microvalves and microactuators. NiTi SMA features the major advantages of having a large output force per unit volume, and the capability to serve as structural components as well as active components. It is reported that the advantageous performance of micro-actuators is attributed to the fact that the shape-memory effect of the stress and strain can produce substantial work per unit of volume. For example, the work output of nickel-titanium shape-memory alloy is of the order of 1 joule per gram per cycle. A shape-memory film micro-actuator measuring one square millimeter and ten microns thick is estimated to exert about 64 microjoules of work per cycle. With a temperature change of as little as about 10° C., this alloy can exert a force of as much as 415 MPa when applied against a resistance to changing its shape from its deformation state.

Previous processes involving MEMS have involved two fabrication techniques: machining of bulk SMA sheets or wires and deposition of SMA films from a NiTi alloy target. Unfortunately, these processes feature miniaturization and productivity limitations. Machining and assembly for MEMS devices using bulk SMA materials restricts manufacturing object size such as thickness of sheet and diameter of wire. Deposition processes have the potential of miniaturization and mass production. Deposition of a sputtered flux from a multicomponent target has been practiced for the growth of thin alloy films of a desired composition. It is known, however, that the composition of the sputtered flux varies with the polar angle of ejection from the target because of the different angular distributions of the individual target constituents. Conventional sputter deposition systems typically include a vacuum enclosure forming a sputter deposition chamber in which a circular sputter target is mounted facing opposite a wafer substrate surface. A magnetron cathode source, with means for producing a magnetic field, is set behind the circular target material. After the sputter deposition chamber has been pumped out to create a vacuum therein to the order of $10^{-5}$ Pa, a sputter process gas, such as argon, is fed into the chamber and held at a fixed process pressure. The magnetron cathode generally features a center magnet and an annular magnet surrounding the outer circumferential edge of the center magnet, which develops a magnetic field across the circular target. When voltage is applied, a discharge occurs between the target and the substrate and the target material undergoes a sputtering action and a film made of the target material is deposited on the substrate. To acquire shape memory properties, the deposited film material must be deposited on a heated substrate, or a post-deposition annealing step must be applied to the film.

Although numerous potential applications for shape-memory alloys now require materials featuring phase transformation temperatures above about 100° C., the martensite start point for the common commercially available nickel-titanium alloys barely exceeds about 80° C. In order to meet higher temperature applications, ternary alloys have been investigated, using various additional metallic elements. For example, substitution of noble metals (Au, Pd, Pt) for Ni in NiTi alloys successfully accomplishes higher temperature phase transformations, but the costs introduced are somewhat prohibitive for many commercial applications. Ternary nickel-titanium shape-memory alloys including a zirconium or hafnium component appear to be potentially economical high temperature shape-memory candidates.

Devices, such as actuators, made from shape-memory thin film with high transformation temperatures offer two advantages over Ni—Ti SMA film that is currently available: they can be used at higher ambient temperature where Ni—Ti film would not be functional; and, they can be operated at higher frequency due to faster response time that is primarily limited by rate of heat dissipation to surroundings. Although there have been attempts to develop high-temperature SMA thin films particularly with Ni—Ti—Hf composition, the results were unsatisfactory, because the increase of transformation temperatures by additional hafnium was inadequate, and, the mechanical properties were unsatisfactory for any real applications.

Accordingly, there exists a challenge to develop a reliable process for producing microns-thick thin films of high temperature shape-memory alloys.

SUMMARY OF THE INVENTION

A magnetron sputtering deposition process now has been developed for forming a thin film deposit of a Ni—Ti—Hf ternary shape memory alloy on a substrate by having high transformation temperatures and good shape-memory and mechanical properties. The disclosed method of forming a thin film deposit of a ternary shape memory alloy on a substrate by sputtering deposition comprises arranging a Ni—Ti—Hf target and a substrate within a deposition chamber; maintaining a working distance from the target to the substrate of about 83 mm to 95 mm; heating the substrate to a temperature high enough to induce in-situ crystallization; introducing a krypton working gas into the deposition chamber; applying appropriate level of deposition power so the deposition rate is about from about 6 Å per second to 120 Å per second; and, depositing a Ni—Ti—Hf shape memory alloy film having a composition ranging from $Ni_{48}(TiHf)_{52}$ to $Ni_{50}(TiHf)_{50}$.

Pursuant to the presently disclosed method, planar magnetron sputtering is used to conduct thin film deposition, employing a target composition selected to produce a deposited alloy film having a composition ranging between $Ni_{48}(TiHf)_{52}$ and $Ni_{50}(TiHf)_{50}$. It has been determined that the composition of the thin film is an important factor in determining the transformational and mechanical characteristics of the SMA thin film. It was found that maintaining the thin film with 48 to 50 at.% of nickel (with balance of titanium+hafnium), preferably with nickel 48.5 at % to 49.5 at %, serves to ensure the thin film has high transformation temperatures as well as good mechanical strength. Particularly preferred are Ni—Ti—Hf alloy films wherein the Hf component ranges between about 10 at % and about 30 at %, preferably between about 15 at % to 25 at %.

It further has been determined that proper selection of the sputtering parameters, including substrate temperature, working gas composition and pressure, substrate-to-target distance ("working distance"), deposition power, and sputtering rate, also is important to control the mechanical characteristics of the thin film.

The substrate should be heated to a temperature high enough to induce in-situ crystallization. It has been determined that both the temperature of the substrate during deposition, as well as the procedure of heating the substrate, have significant impact upon properties of the as-deposited alloy thin films. Crystalline films that exhibit favorable shape memory effect can be obtained when the substrate temperature reached between about 350° C. and about 450° C. during deposition. To heat the substrate to this deposition temperature, it is preferred to follow a routine comprising first to heat the substrate to a temperature higher than deposition temperature, preferably between about 400° C. and about 450° C., at the commencement of deposition, and then to allow the substrate to lower in temperature gradually, and preferably down by about 50° C., to about 350° C. to about 400° C., during the deposition process. This pre-heating procedure serves to produce film deposits with improved roughness and shape memory properties.

Utilizing krypton as working gas instead of conventionally used argon is preferred for improved thin film properties. The krypton gas pressure during deposition preferably is about 0.5 mTorr and about 3.0 mTorr. A pressure ranging between 0.5 mTorr and about 1.5 mTorr is particularly preferred.

The presently described method further involves proper setting of deposition power and working distance in order to ensure good thin film quality and uniformity while maintain a reasonable deposition rate. Depending on the target size, deposition power should be adjusted in order to realize deposition between about 6 Å/sec to about 120 Å/sec. In selecting the working distance, one has to consider the focus of plasma that affects compositional uniformity of the deposit. It has been found that by setting working distance at from about 83 mm to about 95 mm, material within 5"-diameter area is useful with respect to 8"-diameter target.

BRIEF DESCRIPTION OF THE DRAWINGS

The above discussed and other features and advantages will be appreciated and understood by those skilled in the art from the following detailed description and drawings, wherein like elements are designated by like numerals in the several figures.

Referring now to the drawings:

In FIG. 3a, a test is conducted at room-temperature and the material is fully martensite.

DESCRIPTION OF A PREFERRED EMBODIMENT

In the presently disclosed sputtering process, the sputtering deposition generally takes place in a chamber, such as a Perkin Elmer chamber. The thin film preferably is obtained by deposition from a hot-pressed metal powder targets. The specific preferred process parameters for sputtering deposition are dependent on the specific sputtering equipment employed. An initial base vacuum pressure first is established; this pressure ranges from about $5\times10^{-6}$ torr or lower. Preferably, the base vacuum pressure ranges from about $1\times10^{-6}$ to about $1\times10^{-7}$ torr.

During the ion sputtering process, ionization process gas should be maintained at a pressure ranging from about 0.5 to about 3.0 mTorr. Preferably, process gas pressure ranges from about 0.5 mTorr to about 1.5 mTorr. When the working gas pressure is too high (greater than about 3.0 mTorr), deposited film tends to become rough and porous; at low working gas pressure (less than about 0.5 mTorr), the plasma becomes unstable and the deposited film tends to become rough again. The ionizing process gas utilized is krypton, rather than conventional process gas, such as argon.

For an 8 inch diameter target, the power applied during sputtering should range between about 300 watts to about 6 kilowatts (corresponding to power density from about 9.2 $kW/m^2$ to about 185 $kW/m^2$); preferably the power applied ranges from about 500 watts to about 2500 watts (corresponding to power density from 15.4 $kW/m^2$ to about 77 $kW/m^2$). The sputtering rate, which is approximately linear to the deposition power, should range between about 6 Å/sec to about 120 Å/sec; preferably the sputtering rate ranges between about 10 Å/sec to about 45 Å/sec. When the deposition rate is too high (greater than about 120 Å/sec), surface diffusion activity was limited, deteriorating crystallinity of the deposited film; when the deposition rate is too low, the process becomes impractical since thin film deposition takes too long. At the same time, the working distance should be set at from about 83 mm to 95 mm in order to make 5"-diameter area useful.

Figure 1:
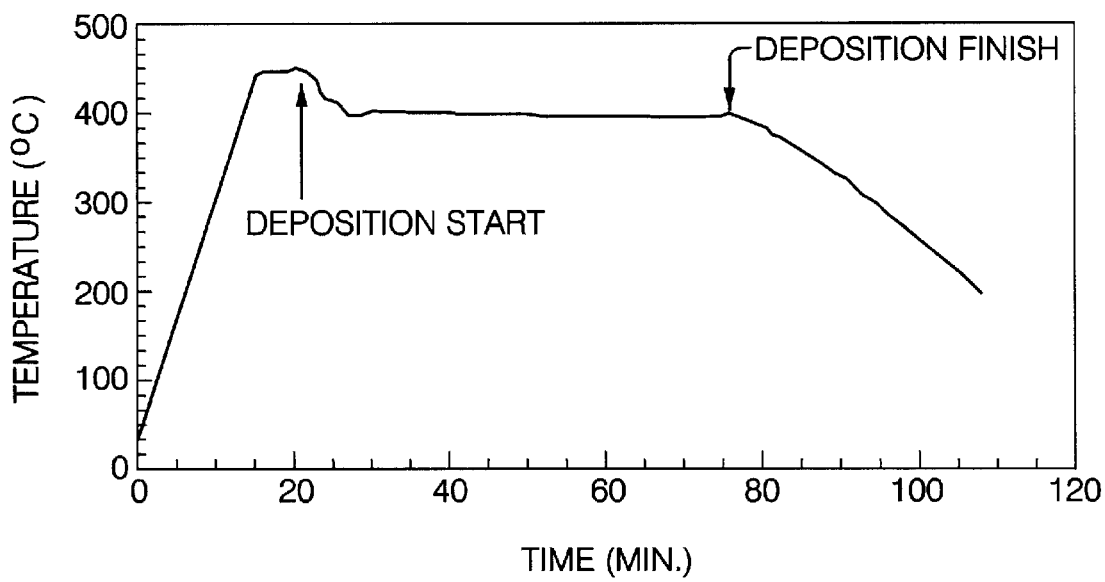
FIG. 1 is a graph showing the temperature profile of the substrate during pre-heating, sputtering and cooling down used for Ni—Ti—Hf SMA thin film deposition as described herein. The resulting film shows a smooth surface and has good mechanical properties.
Figure 2:
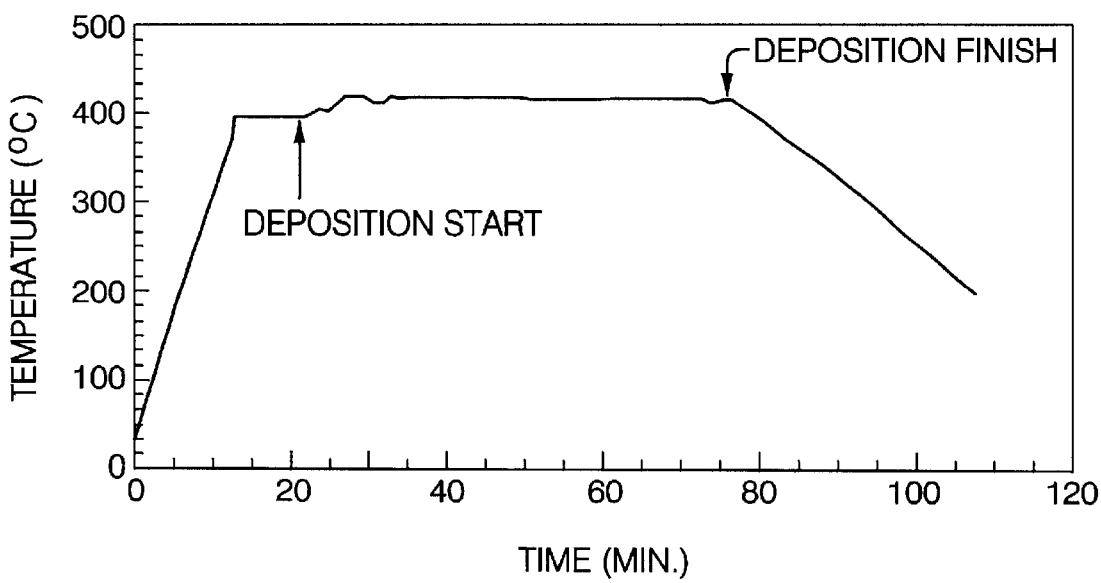
FIG. 2 is a graph showing the temperature profile of the substrate during baking, deposition, and cool down in a conventional sputtering procedure. Using this heating procedure for Ni—Ti—Hf thin film deposition results in rough surface of the grown film and the material has poor mechanical strength.

Although Ni—Ti binary SMA film can be made either by crystallizing amorphous film that is deposited at lower substrate temperature, or by inducing in-situ crystallization via providing sufficient heating to the substrate, Ni—Ti—Hf SMA film has to be made by the latter technique. Crystallization from amorphous simply makes very brittle films. Besides, special procedure of substrate heating needs to be performed in order to ensure good quality of the films. The temperature profile is illustrated in FIG. 1. In detail, set the substrate temperature at about 400° C. to 450° C. at the very early stage of the deposition, and then allow the substrate temperature gradually cools down to about 50° C. lower than the initial temperature at the commencement of the deposition. Compared to the film made by a procedure without setting the initial temperature higher (as schematically shown in FIG. 2), Ni—Ti—Hf SMA film produced using heating procedure in FIG. 1 shows much better surface smoothness, and it is also more strong and ductile, and adheres to the substrate better.

Thin films having a wide range of compositions and thickness can be deposited using the present process. Slightly TiHf rich compositions ensure that the thin film has high transition temperature and good mechanical property. The atomic composition should be within the range from $Ni_{48}(TiHf)_{52}$ to $Ni_{50}(TiHf)_{50}$, preferably between $Ni_{49.5}(TiHf)_{50.5}$ and $Ni_{48.5}(TiHf)_{51.5}$. The hafnium content in the alloy depends on the desired transformation temperatures. However it should be between about 10 at % to about 30 at %, preferably between about 15 at % and about 25 at %.

It is realized that the composition of the thin film is primarily determined by the target composition. Therefore, an empirical relationship between thin film composition and target composition needs to be established for a particular sputtering machine. However, generally there is about 1 to 3% discrepancy for each element. Finer adjustment of composition can be realized by varying sputtering parameters, especially the working gas pressure. Up to 1% compositional shift can be made by varying Kr pressure within the range defined above. The general trend is that lower krypton pressure, higher sputtering rate and longer working distance tend to bring the nickel up and hafnium down, while titanium content stays unchanged. Additionally, operating the sputtering machine at lower pressure, higher sputtering rate and longer working distance is beneficial to make more uniform material over large area of the substrate.

The thickness of the Ni—Ti—Hf thin film also depends on the application requirement. However, based on the mechanical characteristics of the Ni—Ti—Hf SMA thin films and limitation of the sputtering process, the thickness should range from about 1 micron to about 10 microns, preferably from about 2 microns to about 5 microns.

The following examples are provided to further describe the invention. The examples are intended to be illustrative and are not to be construed as limiting the scope of the invention.

EXAMPLE 1

8"-diameter targets with different Ni—Ti—Hf ternary compositions were prepared by hot pressing method. Based on the empirical composition shift between thin film and target, compositions of the targets were selected in order to make slightly Ti rich films. Hot pressing was accomplished by standard procedure and the final density of the target was measured to determine fraction of porosity. Table A shows the composition of targets that were used for this study, their theoretical and measured density, and the fraction of porosity calculated accordingly. To protect targets from oxygen contamination, they were sealed in Kr until ready to be put into vacuum chamber.

TABLE A

Target composition, final density and calculated porosity

| Composition of Target | $Ni_{47.5}Ti_{29.5}Hf_{23}$ | $Ni_{47.5}Ti_{32.5}Hf_{20}$ | $Ni_{47.5}Ti_{34.5}Hf_{18}$ | $Ni_{48.5}Ti_{35.5}Hf_{16}$ | $Ni_{48}Ti_{38}Hf_{14}$ |
|---|---|---|---|---|---|
| Theoretical Density (g/cc) | 8.83 | 8.49 | 8.27 | 8.08 | 7.83 |
| Density Measured g/cc | 7.46 | 6.91 | 7.24 | 7.16 | 6.85 |
| Porosity (%) | 15.5 | 18.6 | 12.5 | 11.4 | 12.5 |

Ni—Ti—Hf ternary films with different compositions were sputter deposited on hot 5"-diameter oxide passivated Si substrates using the hot pressed targets described above. The procedure for substrate heating before and during deposition is illustrated in FIG. 1, i.e., prior to deposition, heating the substrate to about 450° C. Plasma is initiated by powering the cathode, and about 10 minutes of pre-sputtering is conducted before exposing the substrate directly to the target. After the substrate is exposed to the target, decrease the power of heater to substrate and then allow the substrate temperature decrease to about 400° C. Other deposition parameters are: base pressure about $1\times10^{-6}$ torr before deposition, working gas Kr pressure 1.0 mTorr during deposition, target-to-substrate distance 91 mm, deposition power 1.0 kW, and deposition time 53 minutes. The thickness of thin film was about 4.5 $\mu$m. Chemical composition of the film around wafer center was measured by x-ray Energy Dispersive Spectrum (EDS) equipped on a Scanning Electron Microscope (SEM), and the transformation temperatures were measured by Differential Scanning Calorimetry (DSC). The composition and the transition temperatures of film deposited from each target are shown in Table B. It is indicated that the martensitic finish temperature ranging from about 110° C. to about 195° C. can be obtained by varying the hafnium content from 14 at % to 25 at %.

TABLE B

Composition and Transition Temperatures of Ternary Films Sputtering From Different Targets

| Target Composition | $Ni_{47.5}Ti_{29.5}Hf_{23}$ | $Ni_{47.5}Ti_{32.5}Hf_{20}$ | $Ni_{47.5}Ti_{35.5}Hf_{18}$ | $Ni_{48.5}Ti_{35.5}Hf_{16}$ | $Ni_{48}Ti_{38}Hf_{14}$ |
|---|---|---|---|---|---|
| Film Composition | $Ni_{49}Ti_{25.8}Hf_{25.2}$ | $Ni_{49}Ti_{29.2}Hf_{21.8}$ | $Ni_{49}Ti_{33.4}Hf_{17.6}$ | $Ni_{49.7}Ti_{33.9}Hf_{16.4}$ | $Ni_{49.3}Ti_{36.2}Hf_{14.3}$ |
| $M_s$(° C.) | 260 | 200 | 165 | 150 | 119 |
| $M_f$(° C.) | 195 | 165 | 135 | 125 | 111 |
| $A_s$(° C.) | 305 | 230 | 190 | 180 | 153 |
| $A_f$(° C.) | 350 | 260 | 235 | 200 | 165 |

Figure 3:
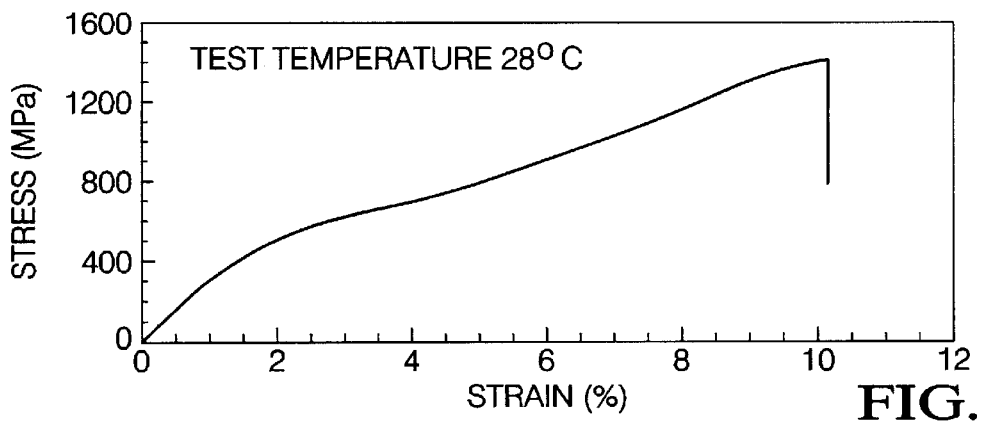
FIGS. 3a.–3d, show a series of strain-stress curves of $Ni_{49.7}Ti_{33.9}Hf_{16.4}$ thin film prepared by using the procedure as illustrated in the present description. Tensile tests are performed at different temperatures, so that the phase of the material is different.
In FIG. 3b, a sample is heated to 150° C. from room temperature and tested at 150° C. The material is still fully martensite.
In FIG. 3c, a sample is heated to 250° C. from room temperature and tested at 250° C. The material becomes fully austenite before the test and remains austenite after the test.
In FIG. 3d, a sample is heated to 250° C. from room temperature, then cooled down to 160° C. and tested at 160° C. Before the test the material is fully austenite, but martensite forms during the test.
Figure 3:
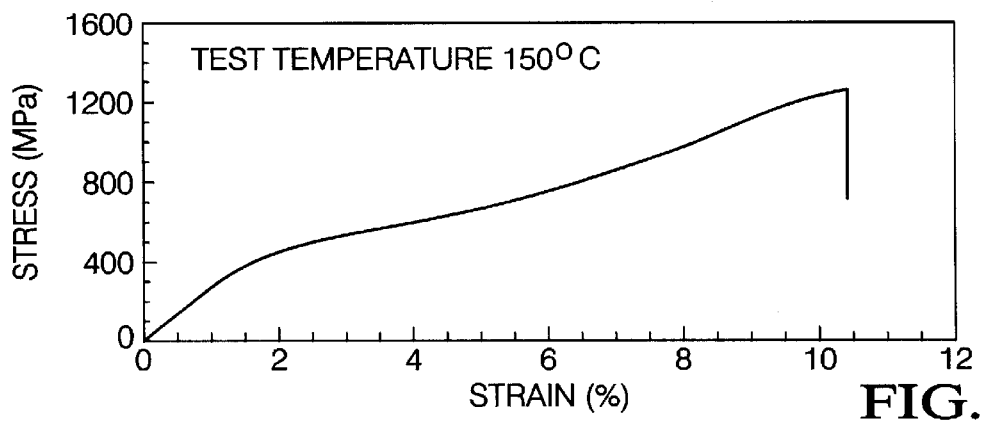
Figure 3:
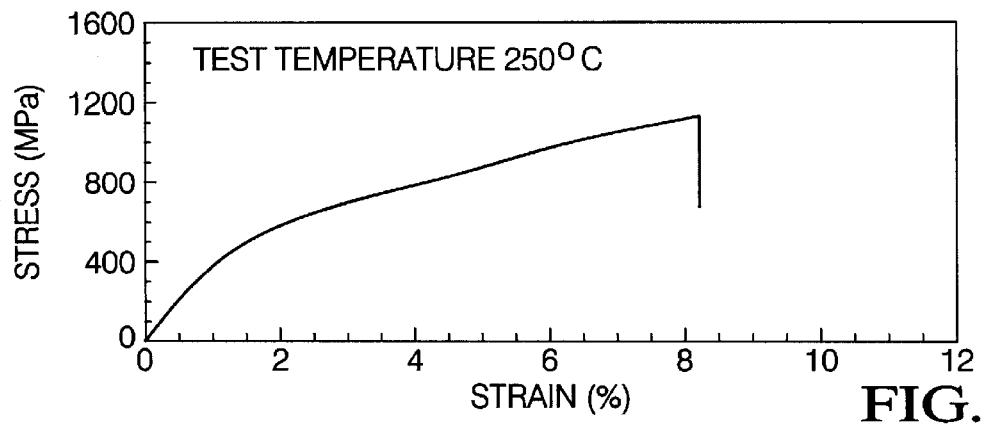
Figure 3:
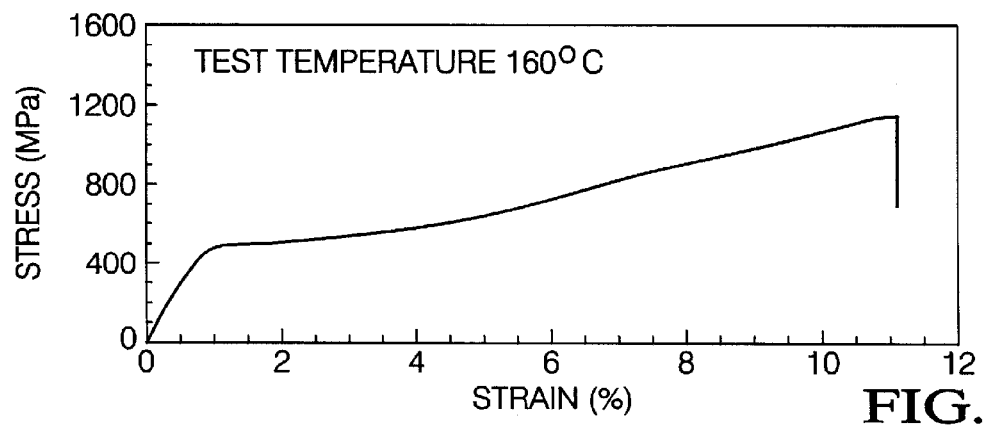

Mechanical and shape-memory properties of the deposit are evaluated by tensile testing at different temperatures and thermal cycling under constant load. Thin film used in these tests is mechanically delaminated from the substrate and cut to 3 mm×30 mm dimension strips. FIG. 3 shows series of strain-stress curves of tensile tests that are conducted at different temperatures at a strain rate of 0.0005/sec. About 10% ultimate elongation can be obtained at low-temperature martensite phase (FIG. 3a). It appears martensite variants start to reorient at 500 MPa but typical plateau-like deformation in the binary Ni—Ti is not observed. When deformed at higher temperature but still martensite (FIG. 3b), similar amount of ultimate elongation can be obtained, but martensite variant reorientation becomes easier since the onset stress is apparent lower although still no plateau-like stage. At high-temperature austenite phase, the ultimate elongation is slightly decreased and the curve is typical for ordinary alloys (FIG. 3c). At relatively lower temperature but still austenite phase, the plateau-like deformation stage appears and it is associated with the occurrence stress-induced martensite transformation (FIG. 3d).

Figure 4:
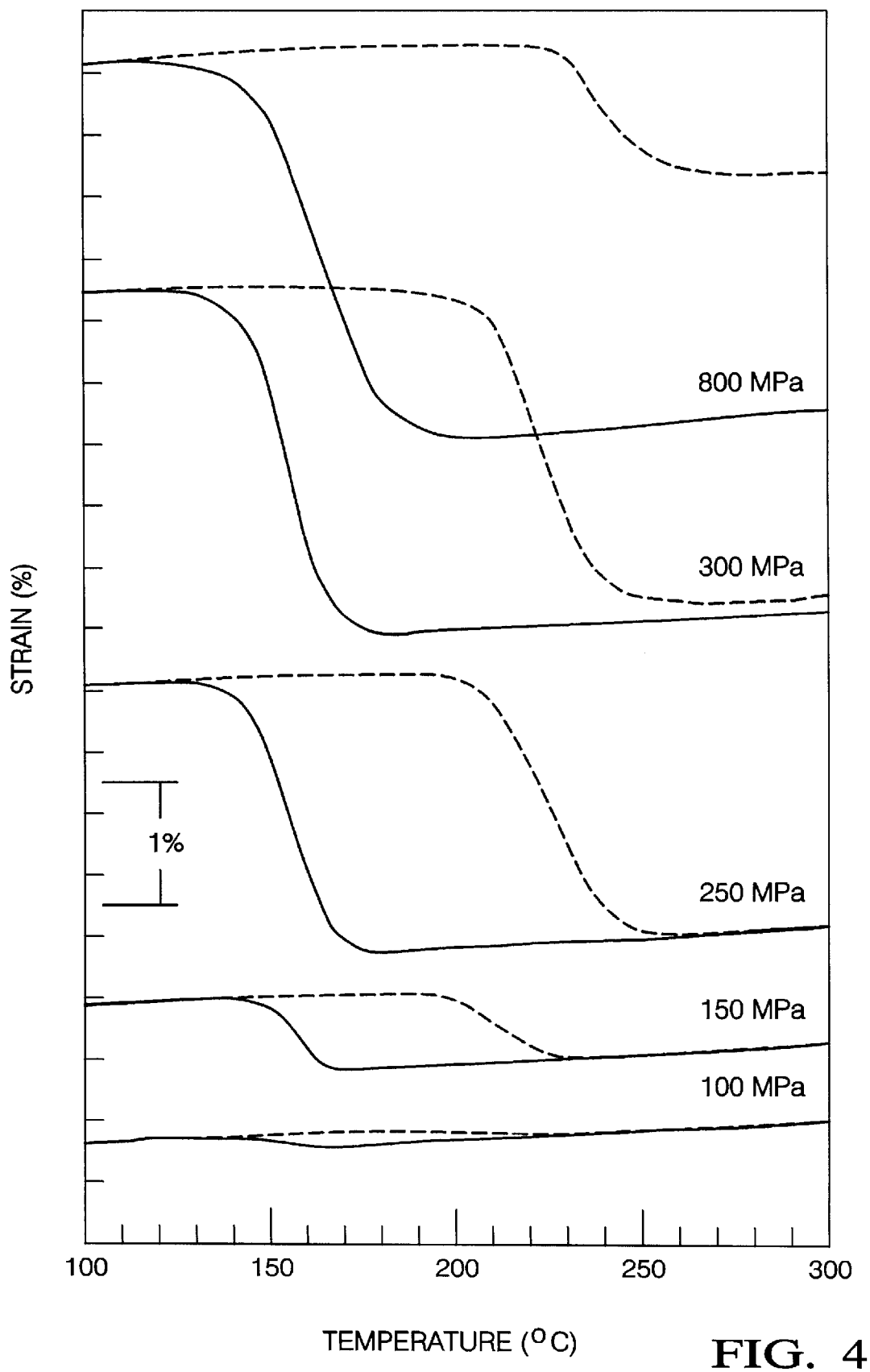
FIG. 4 shows a series of temperature-strain curves of $Ni_{49}Ti_{33.6}Hf_{7.6}$ films prepared by using the procedure illustrated in the present description. Those curves are obtained by thermal cycling the sample strips from about 100° C. to about 300° C., while keeping a constant load during each cycle. It is indicated that shape-memory strain is generated upon cooling to martensite and recovered upon heating to austenite.

Shape-memory properties are evaluated using test method of thermal cycling at constant load. FIG. 4 shows series strain-temperature curves from such tests. For this sample, it appears the maximum shape memory strain is about 2.5% to 3.0% and fully recoverable stress is between 250 MPa and 300 MPa. Thin film can be cycled at 800 MPa stress for several times without failure, even though at high stress, considerable residual stress is developed from each cycle.

While exemplary embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims, but that the invention will include all embodiments falling within the scope of the appended claims.

We claim:

1. A process for forming a thin film deposit of a ternary shape memory alloy on a substrate by sputtering deposition comprising:
    arranging a Ni—Ti—Hf target and a substrate within a deposition chamber;
    maintaining a working distance from the target to the substrate of about 83 mm to 95 mm;
    heating said substrate to a first temperature high enough to induce in-situ crystallization;
    introducing a krypton working gas into said deposition chamber;
    applying an appropriate level of deposition power so that the deposition rate is from about 6 Å per second to about 120 Å per second; and
    depositing a Ni—Ti—Hf shape memory alloy film having a composition ranging from about $Ni_{48}(TiHf)_{52}$ to $Ni_{50}(TiHf)_{50}$, wherein during said depositing, said substrate temperature decreases.

2. The process of claim 1 wherein said substrate is heated to a temperature from about 350° C. to about 450° C.

3. The process of claim 2 wherein the substrate temperature at the commencement of deposition is about 50° C. higher than during the deposition.

4. The process of claim 1 wherein krypton working gas pressure is about from 0.5 mTorr to 3.0 mTorr.

5. The process of claim 1 wherein krypton working gas pressure is from about 0.5 mTorr to 1.5 mTorr.

6. The process of claim 1 wherein said target is a hot-pressed metal powder target.

7. The process of claim 1 wherein said alloy film comprises about 10 at % to 30 at % hafnium.

8. The process of claim 1 wherein said alloy film comprises about 15 at % to 25 at % hafnium.

9. The process of claim 1 wherein said alloy film comprises about 48.5 at % to about 49.5 at % nickel.

10. The process of claim 1 wherein said substrate first is heated to a temperature from about 400° C. to about 450° C. at the commencement of deposition, and then the substrate is allowed to lower in temperature to about 350° C. to about 400° C. during deposition.

11. A process for forming a thin film deposit of a ternary shape memory alloy on a substrate by sputtering deposition comprising:
    arranging a Ni—Ti—Hf target and a substrate within a deposition chamber;
    maintaining a working distance from the target to the substrate of about 83 mm to 95 mm;
    heating said substrate to a first temperature ranging from about 350° C. to about 450° C. in order to induce in-situ crystallization;
    introducing a krypton working gas into said deposition chamber at a pressure of about 0.5 mTorr to about 3.0 mTorr;
    applying an appropriate level of deposition power so that the deposition rate is from about 6 Å per second to about 120 Å per second; and
    depositing a Ni—Ti—Hf shape memory alloy film having a composition ranging from about $Ni_{48}(TiHf)_{52}$ to $Ni_{50}(TiHf)_{50}$, wherein during said depositing, said substrate temperature decreases.

12. A process for forming a thin film deposit of a ternary shape memory alloy on a substrate by sputtering deposition comprising:
    arranging a Ni—Ti—Hf target and substrate within a deposition chamber;
    maintaining a working distance from the target to the substrate of about 83 mm to 95 mm;

heating said substrate to a first temperature ranging from about 400° C. to about 450° C. at the commencement of deposition, and the allowing the substrate to lower in temperature to about 350° C. to about 400° C. during deposition;

introducing a krypton working gas into said deposition chamber at a pressure of about 0.5 mTorr to about 3.0 mTorr;

applying an appropriate level of deposition power so that the deposition rate is from about 6 Å per second to about 120 Å per second;

deposition a Ni—Ti—Hf shape memory alloy film having a composition ranging from about $Ni_{48}(TiHf)_{52}$ to $Ni_{50}(TiHf)_{50}$, including about 10 at % to about 30 at % hafnium.

* * * * *